United States Patent [19]

Takahashi et al.

[11] Patent Number: 5,751,091
[45] Date of Patent: May 12, 1998

[54] PIEZOELECTRIC POWER GENERATOR FOR A PORTABLE POWER SUPPLY UNIT AND PORTABLE ELECTRONIC DEVICE EQUIPPED WITH SAME

[75] Inventors: Osamu Takahashi; Yasuharu Hashimoto; Eiichi Nagasaka; Hajime Miyazaki; Tsukasa Funasaka, all of Suwa, Japan

[73] Assignee: Seiko Epson Corporation, Tokyo, Japan

[21] Appl. No.: 594,566

[22] Filed: Jan. 31, 1996

[30] Foreign Application Priority Data

Feb. 1, 1995 [JP] Japan ............... 7-015117
Nov. 24, 1995 [JP] Japan ............... 7-306188
Jan. 12, 1996 [JP] Japan ............... 8-004362

[51] Int. Cl.⁶ .......................................... H01L 41/08
[52] U.S. Cl. .......................... 310/339; 310/332; 310/319
[58] Field of Search ........................ 310/330–332, 310/339, 319, 321, 800

[56] References Cited

U.S. PATENT DOCUMENTS

| | | | |
|---|---|---|---|
| 2,921,252 | 1/1960 | Schiavone | 310/339 X |
| 3,336,529 | 8/1967 | Tygart | 310/319 X |
| 3,370,187 | 2/1968 | Straube | 310/330 |
| 3,456,134 | 7/1969 | Ko | 310/330 |
| 3,500,451 | 3/1970 | Yando | 310/332 |
| 4,091,302 | 5/1978 | Yamashita | 310/339 |
| 4,510,484 | 4/1985 | Snyder | 340/58 |
| 4,695,988 | 9/1987 | Banno | 310/800 X |
| 5,034,649 | 7/1991 | Chida et al. | 310/332 |
| 5,049,776 | 9/1991 | Ogawa | 310/339 X |

FOREIGN PATENT DOCUMENTS 51-17393  8/1971  Japan.

*Primary Examiner*—Mark O. Budd
*Attorney, Agent, or Firm*—Stroock & Stroock & Lavan LLP

[57] ABSTRACT

A power generator is provided and includes a piezoelectric transducer which generates electric power upon application of a strain. The power generator includes a vibrating arm having a sandwich structure wherein a support layer is held between at least two piezoelectric portions. The vibrating arm is wider on the support end than at a free end. The piezoelectric portions are extended to a root portion of the vibrating arm so that strain energy may efficiently be converted into electric energy. The piezoelectric portions each have a laminated structure so that piezoelectric power generator having the electromotive voltage and the capacitance optimum for charging may be realized.

4 Claims, 11 Drawing Sheets

FIG. I

PIEZOELECTRIC POWER GENERATOR FOR A PORTABLE POWER SUPPLY UNIT AND PORTABLE ELECTRONIC DEVICE EQUIPPED WITH SAME

BACKGROUND OF THE INVENTION

The present invention relates generally to a piezoelectric power generator for generating electric power by utilizing mechanical vibrations, and more particularly, to a piezoelectric power generator that converts kinetic energy of a weight or the like into electric energy through a vibrating arm (i.e. beam) that may be mounted in a small-sized portable electric device such as a watch.

A small-sized power supply unit for portable watches is disclosed in Japanese Patent Publication No. 51-17393. The small-sized portable power supply unit generates electric power by applying a strain to a piezoelectric transducer with motion from a rotating weight. In the prior art small-sized portable power supply unit, a piezoelectric transducer is fixedly attached to a spring-like lever so that a strain is repeatedly applied to the piezoelectric transducer by vibrations of the lever. As a result, electric power generated by the piezoelectric transducer is utilized as a power source.

In such a power generator, energy applied to the spring-like lever (hereinafter "input energy") and the piezoelectric transducer is divided into threes categories of energy: (1) strain energy of the spring-like lever, (2) strain energy of the piezoelectric transducer, and (3) electric energy generated by the piezoelectric transducer and stored in an electric condensing portion. Of these three kinds of energy, the electric energy that is most important for the power generator fluctuates depending on the electromechanical coupling coefficient of the piezoelectric transducer, the output voltage (hereinafter "electromotive voltage") and the capacitance of the piezoelectric transducer when it is not charged, the voltage of the electric condensing portion (hereinafter "condenser voltage"). However, since the lever vibrates repeatedly and a strain is repeatedly applied to the piezoelectric transducer, the strain energy of both the spring-like lever and the piezoelectric transducer may be converted into electric energy in a gradually increasing manner. Therefore, it is possible to produce a greater amount of electric energy than converted per one cycle of vibration. Nevertheless, the conversion efficiency represented by the total amount of electric energy outputted as compared with the input energy is low. As a result, the conversion efficiency needs to be improved.

Moreover, the power generator using the piezoelectric transducer, described in Japanese Patent Publication No. 51-17393, may generate electric power, but its outer configuration is too large to be used in portable devices. Therefore, it is also necessary to create a small-sized power generator with higher conversion efficiency. Furthermore, there are a number of internal problems in creating a power generator in a portable device. For example, in a construction including a cantilevered beam having a spring-like lever and a piezoelectric transducer attached to the lever, strain energy of both the spring-like lever and the piezoelectric transducer is liable to leak through a fixed portion. As a result, energy loss increases (hereinafter "vibration leakage") and makes it difficult to improve the conversion efficiency. The vibration leakage may be reduced by increasing the rigidity of the fixed portion. However, increasing the rigidity of the fixed portion would result in increasing the size of the fixed portion and hence has limitations for incorporation into portable devices.

Second, a piezoelectric transducer converts strain energy applied to itself in the form of only compression and tension into electric energy, the efficiency of which corresponds to the degree of the compression and tension. Typically, because only a very small part of strain energy of the spring-like lever is imparted as strain energy of the piezoelectric transducer, the conversion efficiency is very low. The conversion efficiency is very low, in part, because the strain energy in a root portion of the spring-like lever undergoes a maximum strain and is not imparted to the piezoelectric transducer. Further, because the spring-like lever and the piezoelectric transducer are joined to each other through an adhesive layer, the adhesive layer behaves as a buffer member to reduce the strain applied to the piezoelectric transducer and also produces energy loss therein. Accordingly, most of the input energy is lost as vibration leakage.

Third, a power generator using a piezoelectric transducer may produce a high voltage, because the piezoelectric transducer has a small capacitance (hereinafter "electrostatic capacity"). At the same time, the generated current is very small. This results in poor efficiency when the power generator employed for charging a power supply with high voltage is used in portable electronic devices.

Fourth, while it is convenient from a structural standpoint to have a vibrating arm to generate electric power by utilizing a transverse effect wherein the direction of propagation of elastic waves is perpendicular to the direction of generated voltage, the conversion efficiency may further be increased if electric power is generated by utilizing a longitudinal effect. In this arrangement, the direction of propagation of elastic waves is the same as the direction of generated voltage and the electro-mechanical coupling coefficient has a larger value. However, the structure of the conventional vibrating arm typically does not utilize the longitudinal effect.

Accordingly, it is desirable to provide an improved and efficient piezoelectric generator for use with portable electronic devices.

SUMMARY OF THE INVENTION

Generally speaking, a piezoelectric power generator is provided. The piezoelectric power generator includes a vibrating arm having a free end being able to freely vibrate and a support end for supporting the free end. The vibrating arm includes at least two piezoelectric portions with a support layer therebetween. Electrodes cover at least parts of the piezoelectric portions. The vibrating arm includes a power generating section capable of outputting an alternating current through the electrodes and being formed on at least the support end. In this construction, the cross-sectional area of the support layer is less than or equal to 60% of the cross-sectional area of the vibrating arm. Alternatively, the vibrating arm of the piezoelectric generator may include two vibrating arms each having a free end being able to freely vibrate in a support end for supporting the free end.

A portable power supply unit having a piezoelectric power generator is also provided. The piezoelectric power generator includes a vibrating arm having a free end being able to freely vibrate and a support end for supporting the free end. The vibrating arm includes at least two piezoelectric arms and includes at least two piezoelectric portions with a support layer therebetween. Electrodes cover at least parts of the piezoelectric portions. The vibrating arm includes a power generating section capable of outputting an alternating current through the electrodes and being formed on at least the support end. A rectifying device is provided for rectifying the alternating current output from the power generating section. An electronic condensing device is provided for accumulating the rectified current.

Accordingly, it is an object of the invention to provide a power generator having high conversion efficiency using a piezoelectric transducer and to provide a piezoelectric power generator which is small in size to incorporate in portable devices.

Another object of the invention is to provide a piezoelectric power generator which may efficiently utilize strain energy and produce a large current value, while reducing the vibration leakage.

Still another object of the invention is to provide a piezoelectric power generator which may generate electric power by utilizing the longitudinal effect.

A further object of the invention is to provide a piezoelectric power generator in which vibrations are less attenuated and mechanical energy may efficiently be converted into electric energy.

Yet another object of the invention is to provide a piezoelectric power generator suitable for use in portable electronic devices.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
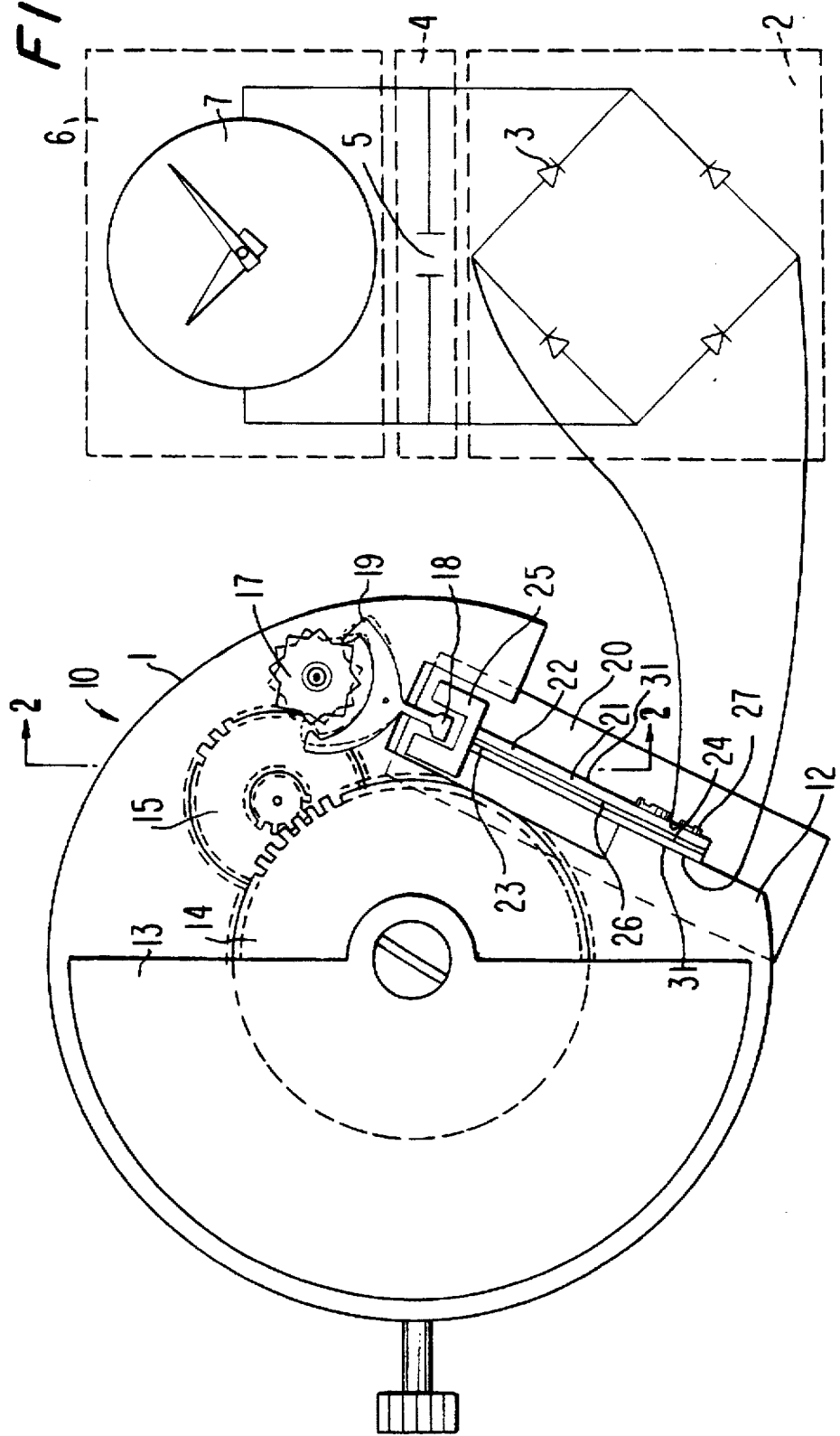
FIG. 1 is a schematic view of a power generator using a piezoelectric substance and a portable device equipped with the power generator constructed in accordance with the invention.
Figure 2:
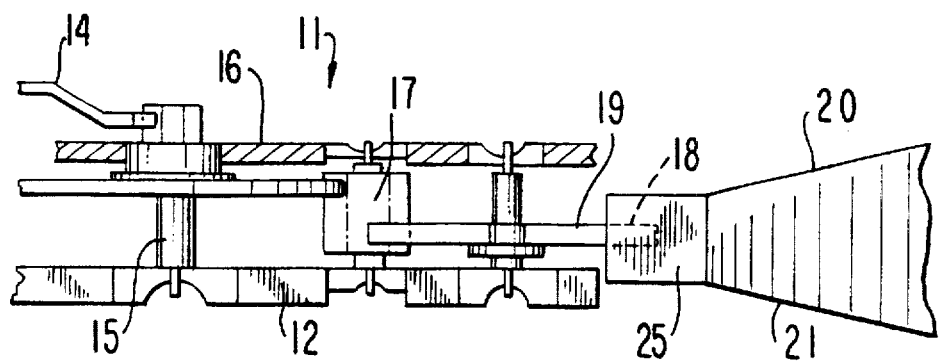
FIG. 2 is a sectional view taken along line 2—2 of FIG. 1.

Reference is now made to FIG. 1 which discloses a wrist watch 10 equipped with a piezoelectric power generator 20. Wrist watch 10 includes a piezoelectric power generator 20 housed in a case 1, a driving system 11 as best shown in FIG. 2 for driving piezoelectric power generator 20, a rectifying circuit 2 for rectifying an alternating current produced by piezoelectric power generator 20, an electric condensing circuit 4 for accumulating a rectified current, and a processing unit 6 for carrying out a clocking process based on the generated current. In a preferred embodiment rectifying circuit 2 includes diodes 3 which are electrically coupled to piezoelectric generator 20. Rectifying circuit 4 is coupled in parallel to a capacitor 5 forming condensing circuit 4 and a watch face 7 of processing unit 6.

Alternatively, processing unit 6, processing unit 6 may function as a radio, a pager, a personal computer or the like. Electric condensing circuit 4 comprises a condenser or capacitor 5 but may be a secondary battery or the like so long as it includes an electricity accumulating capability. Rectifying circuit 2 is not limited to full-wave rectification using diodes 3, but may be a half-wave rectifying circuit or a rectifying circuit using invertors. While FIG. 1 discloses wrist watch 10 in a conceptual view, rectifying circuit 2, electric condensing circuit 4, processing unit 6 are actually arranged in a vertically superimposed relation to driving system 11 for reducing overall size of the watch.

Referring to FIGS. 1–4, piezoelectric power generator 20 used in wrist watch 10 includes a vibrating arm generally indicated as 21 fixed to a base plate 12 in a multilayered manner. Vibrating arm 21 has a sandwich structure comprising a metallic support layer 26 at the center and piezoelectric portions 22a, 22b on both sides thereof. Piezoelectric portion 22 (22a or 22b in FIG. 3) is disposed on opposite sides of support layer 26. Piezoelectric portions 22a and 22b form the power generating section of the device. Vibrating arm 21 has a tip end 23 and a support end 25. A weight 25 is attached to tip end 23 of vibrating arm 21. Weight 25 is operatively coupled to driving system 11 to move weight 25, causing vibrating arm 21 to be vibrated with motion of weight 25 at the tip end. Specifically, when driving system 11 applies vibration to vibrating arm 21, vibrating arm 21 freely vibrates so that the tip end 23 of vibrating arm 21 serves as a free end 23 and an opposite end fixed to base plate 12 by screws 27 serves as a support end 24. As a result, piezoelectric portions 22 generate an electromotive force when vibrating arm 21 vibrates.

Figure 3:
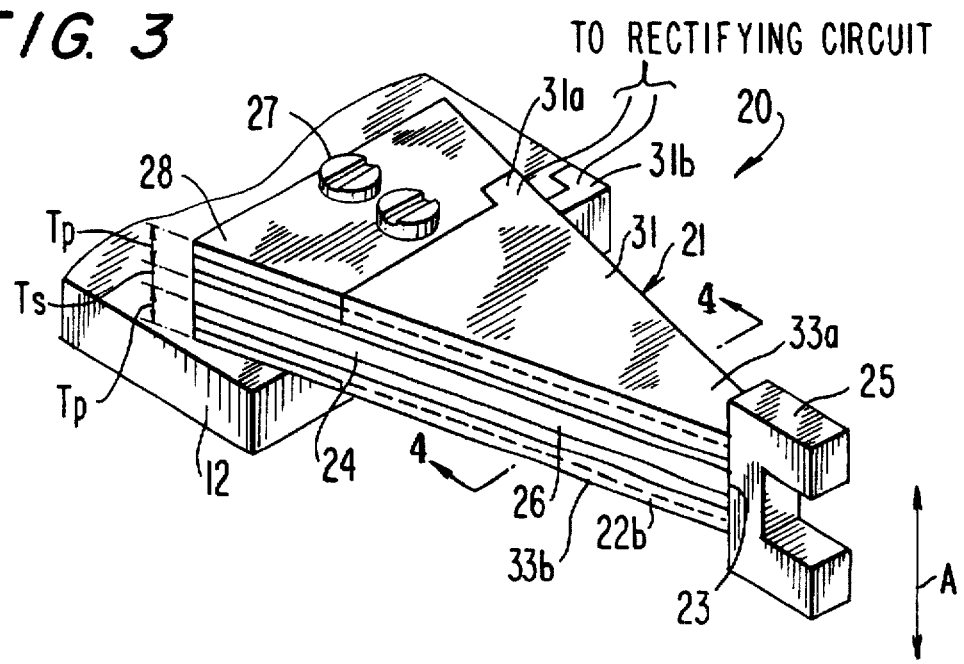
FIG. 3 is a perspective view of the piezoelectric power generator with the vibrating arm of FIG. 1.

Referring to FIG. 3, which shows vibrating arm 21 turned 90° from its position in FIG. 2, the structure of vibrating arm 21 employed in piezoelectric power generator 20 is disclosed in greater detail. Vibrating arm 21 is a plate-like member having a substantially trapezoidal shape. Free end 23, which supports weight 25, is narrower than support end 24. Support end 24 includes a fixed portion 28. Vibrating arm 21 is fixed to base plate 12 through fixed portion 28 by screws 27. An electrode 31 is disposed in each outer surface of vibrating arm 21. Electrode 31 is positioned from a support end 24 contacting base plate 12 to free end 23.

Piezoelectric portions 22a and 22b are disposed on both sides of support layer 26 and are each extended from free end 23 toward support end 24 covering fixed portion 28. Accordingly, a root portion of vibrating arm 21, which undergoes a maximum strain, is covered by piezoelectric portions 22a and 22b so that strain energy produced in the root portion may be converted into electric energy by piezoelectric portions 22a and 22b. Therefore, even if vibrating arm 21 is in the beam-like form, having the same self-attenuation rate as those conventionally used, it is possible to increase the electric energy taken out per stroke of displacement and to improve the conversion efficiency. The root portion of vibrating arm 21 extending from fixed portion 28 on the side of support end 24 toward free end 23 represents a region where the vibration leakage tends to easily occur and strain energy is liable to leak. Thus, in piezoelectric power generator 20, piezoelectric portions 22a and 22b are disposed in the region through which a large amount of energy leaks so that strain energy accumulated in that region may be utilized by piezoelectric portions 22a and 22b. Additionally, strain energy accumulated in support layer 26 may also be utilized for conversion into electric energy. As a result, the conversion efficiency may be improved.

Further, vibrating arm 21 in the piezoelectric power generator is wider on the side of support end 24. Therefore, piezoelectric portions 22a and 22b each have a larger cross-sectional area as they approach the root portion, which undergoes a maximum strain. In this manner, the piezoelectric portions may exhibit a power generating capability almost uniform over the entire vibrating arm. Stated otherwise, in vibrating arm 21, the amount of strain caused upon the vibration of vibrating arm 21 is gradually increased in a direction from free end 23 toward support end 24, while the cross-sectional area of vibrating arm 21 is also gradually increased in the direction from free end 23 toward support end 24. Accordingly, stresses occurred in vibrating arm 21 are substantially equal in each cross-sectional area and any part of the piezoelectric portions has an almost uniform power generating capability. As a result, variations in distribution of electric charges and electromotive voltage are reduced and efficient power generation is achieved.

Moreover, since piezoelectric portions 22a and 22b are each formed so as to extend from free end 23 toward support end 24 including fixed portion 28, stresses are not concentrated on edges of the piezoelectric portions and may be dispersed all over the piezoelectric portions. Consequently, it is possible to alleviate concentration of stresses on parts of the piezoelectric portions and to prevent problems such as peeling-off of the piezoelectric portions.

Figure 4:
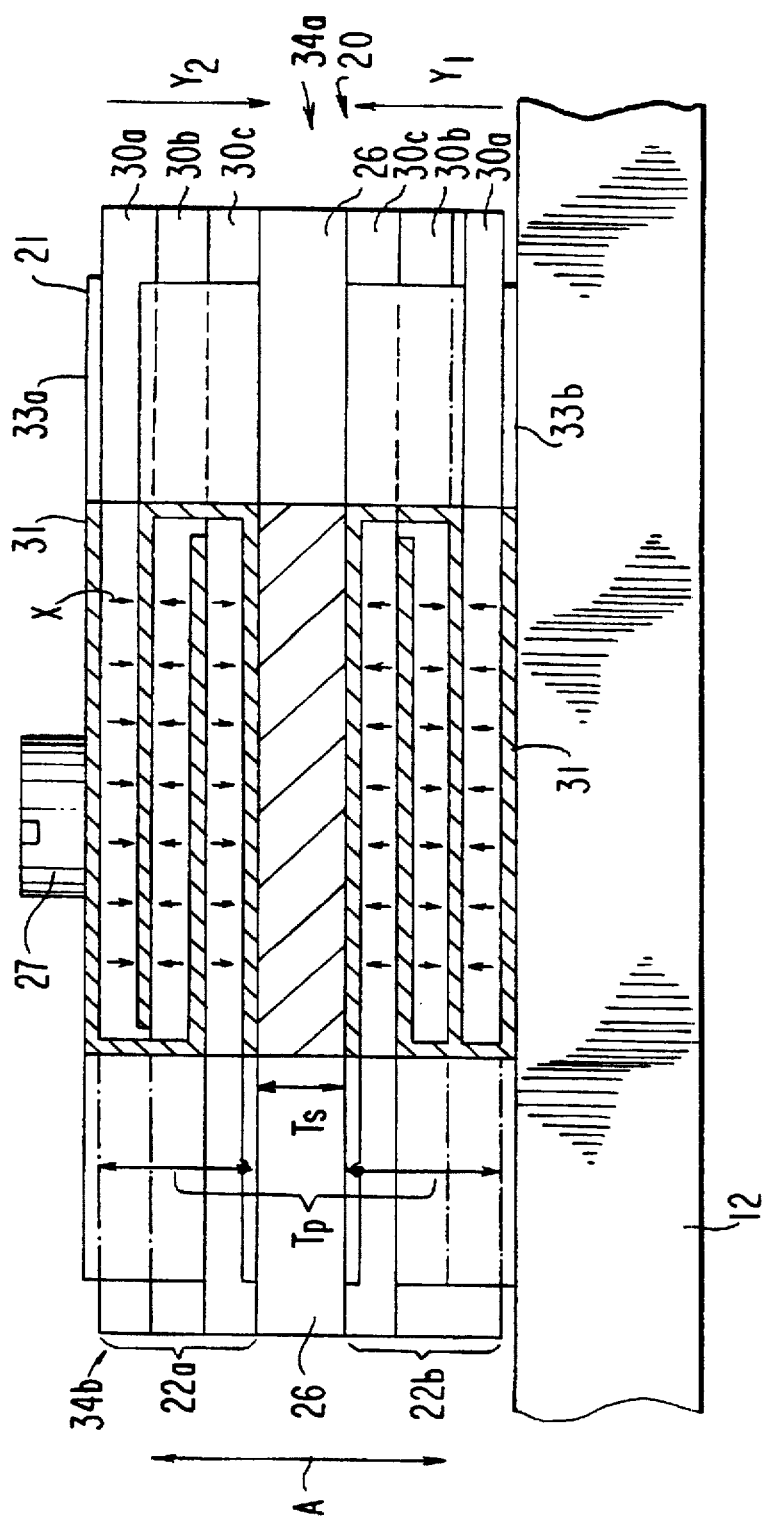
FIG. 4 is an enlarged sectional view taken along line 4—4 of FIG. 3.

Referring to FIG. 4, each piezoelectric portion 22a and 22b has a layered structure comprising three piezoelectric layers 30a, 30b and 30c laminated in the direction of the vibration (indicated by Arrow A). Piezoelectric layers 30a, 30b and 30c are arranged and polarized in opposite directions as indicated by arrows X. In this manner, piezoelectric layers 30a, 30b and 30c are connected in parallel through electrodes 31. Further, the directions of polarization of the piezoelectric layers are selected such that piezoelectric portions 22a and 22b are individually polarized in opposite directions as indicated by arrows Y with support layer 26 therebetween. The upper and lower piezoelectric portions 22a and 22b are connected in series through conductive metallic support layer 26.

Piezoelectric portion 22a, above support layer 26, is compressed and piezoelectric portion 22b, below support layer 26, is tensioned upon the vibration in the upward direction double headed arrow A. Accordingly, vibrating arm 21 generates electric power by utilizing the transverse effect wherein elastic waves propagate in a direction perpendicular to the direction of either $Y_1$, $Y_2$ of the net polarization in which voltage is produced. Since piezoelectric portions 22a and 22b are attached to the upper and lower sides, respectively, of support layer 26 as viewed in the direction of vibrations, vibrating arm 21 serves as a piezoelectric power generating device of bimorph type.

As designed, the thickness of support layer 26 is not greater than 60% of the total thickness of vibrating arm 21 and, in the preferred embodiment, approximately 20% of the total thickness. Stated differently, the ratio of the thickness Ts of FIG. 4 of support layer 26 to the total thickness Tp of FIG. 4 of piezoelectric portions 22a and 22b is equal to or less than 1:1. Therefore, the ratio of the cross-sectional area of support layer 26 to the total cross-sectional area of piezoelectric portions 22a and 22b is equal to or less than 1:1.

Figure 5:
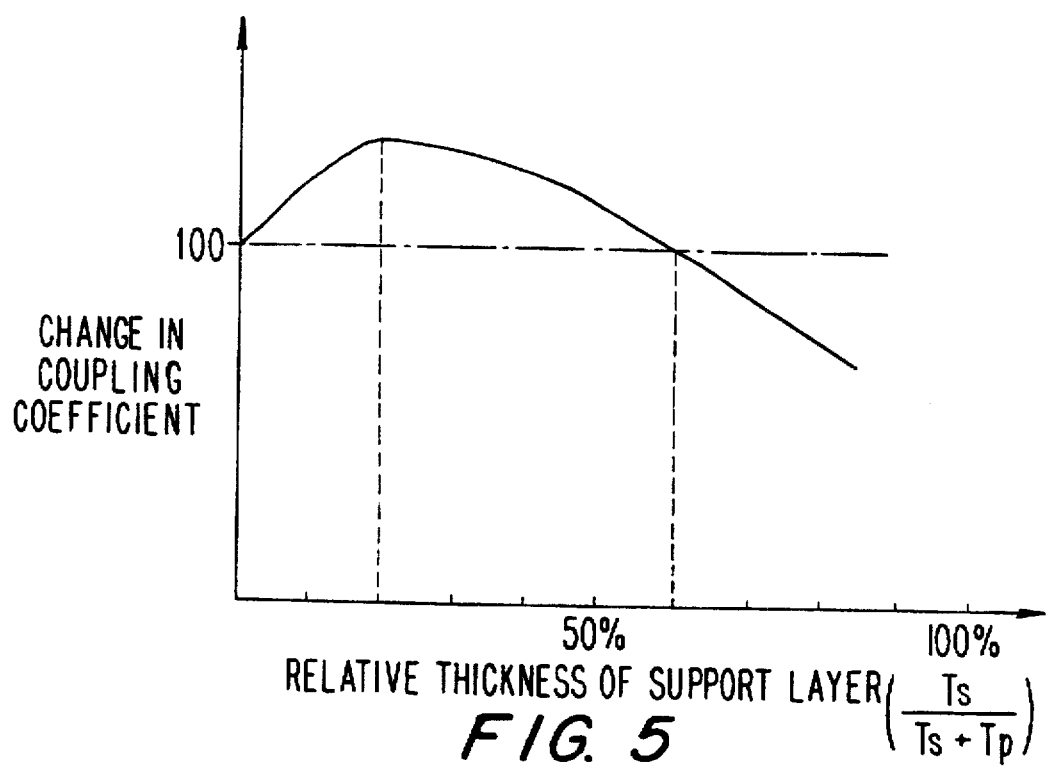
FIG. 5 is a graphical representation showing the change in the coupling coefficient versus the relative thickness of a support layer of the vibrating arm.

FIG. 5 is a graph showing the change in the electromechanical coupling coefficient (hereinafter "coupling coefficient") versus the relative thickness of support layer 26 of vibrating arm 21. For this analysis, support layer 26 is made of copper bronze and piezoelectric portions 22a and 22b are made of PZT® as one of the ceramic-base piezoelectric materials. The coupling coefficient represents the electromechanical conversion efficiency of a piezoelectric transducer and, in this embodiment, it is expressed by the square root of the ratio of energy mechanically input to energy electrically output after conversion.

As shown in FIG. 5, the coupling coefficient is maximized when the relative thickness of support layer 26 is about 20%, and is gradually reduced as the relative thickness increases from 20%. When the relative thickness reaches about 60%, the coupling coefficient is comparable to that of the vibrating arm wherein support layer 26 is not present (i.e., piezoelectric portions 22a and 22b are directly connected to each other). As the relative thickness of the support layer exceeds about 60%, the coupling coefficient is almost monotonously reduced. From the above experiment results, it is understood that when the relative thickness of support layer 26 is preferably within about 60% of the total thickness of the vibrating arm, and in a preferred embodiment, about 20%, it increases the coupling coefficient and obtains a vibrating arm with higher conversion efficiency. If the support layer is too thick, then the strain energy accumulated in the support layer is increased and the percentage of the strain energy converted into electric energy in the piezoelectric portions is reduced. When a support layer is not present, the strain energy is all accumulated in the piezoelectric portions and the conversion efficiency is increased. However, due to practical consideration, such as efficiency of accumulating given impact force as strain energy and attenuation of the vibration, the vibrating arm including the thin support layer provides higher conversion efficiency.

Driving system 11 includes a rotating weight 13 rotatable within case 1. Rotatable weight 13 is coupled along a common shaft to the rotating weight wheel to rotate therewith. Rotating weight wheel 14 is also rotatably mounted between a base plate 12 and a rotating weight receiver 16. Intermediate wheel 15 meshes with a cam driving wheel 17 rotatably mounted between base plate 12 and rotating weight receiver 16. A cam 19 having a projection 18 is pivotally mounted on base plate 12 and operatively cooperates with cam driving wheel 17 and is received by weight 25 so that movement of cam driving wheel 17 moves cam 19 causing projection 18 to move weight 25 causing vibration in vibrating arm 21.

When wrist watch 10 is carried on a user, rotating weight 13 rotates with motion of the user's arm or body and the rotating force is utilized to vibrate vibrating arm 21. To this end, the motion of rotating weight 13 is transmitted to weight 25 at the tip end of vibrating arm 21 through the train of wheels arranged as shown in FIG. 2. First, the motion of rotating weight 13 is transmitted from a rotating weight wheel 14 to an intermediate wheel 15, while increasing the rotational speed. Intermediate wheel 15 and the above-described gears and cams are arranged so as to be able to construct a train of wheels in a narrow space defined within case 1 between base plate 12 and rotating weight receiver 16 which supports rotating weight 13. Rotation of intermediate wheel 15 is transmitted to a cam driving wheel 17, which in turn moves a cam 19 between a first position and a second position (to the left and right shown in phantom in FIG. 1), thereby swinging a projection 18 of cam 19. Projection 18 is positioned in a recess weight 25 at the tip end of vibrating arm 21. Cam 19 is ladle-shaped so that a small moment of inertia is employed to reduce the load of driving system 11. Further, cam driving wheel 17 is employed in combination with intermediate wheel 15 so that the size of cam 19 is reduced.

Accordingly, when a rotating force is applied to rotating weight 13 with the motion of the user's arm or body, cam 19 is moved to the left and right by the applied force causing projection 18 of cam 19 to respectively hit against weight 25 of vibrating arm 21 in a reciprocating motion. This hitting imparts predetermined displacements to vibrating arm 21 and these displacements are accumulated in vibrating arm 21 as strain energy. Then, when cam 19 is returned to the center, vibrating arm 21 vibrates so as to produce electromotive force in piezoelectric portions 22.

Since vibrating arm 21 is vibrated by projection 18 of cam 19 hitting against recessed inner walls of the channel-shaped weight 25 at the aim tip end, the direction of the vibration is vertical in FIG. 3 as indicated by arrow A. Thus, because vibrating arm 21 is wide in a direction perpendicular to the direction of the vibration (Arrow A), vibrating arm 21 is relatively pliable in the direction of the vibration, but relatively hard in the direction perpendicular to the direction of the vibration. Therefore, the strain in the vertical direction A applied from cam 19 causes a stable vibration.

Most of the mechanically input energy is accumulated in piezoelectric portions 22a and 22b, because support layer 26, constructed of metal or the like, is centrally positioned between piezoelectric portions 22a and 22b and therefore undergoes no appreciable strain. More specifically, assuming the condition where vibrating arm 21 is displaced, parts of vibrating arm 21, which are close to its upper and lower surfaces, including the piezoelectric portions 22a and 22b, are subject to large displacements, whereas parts of the vibrating arm which are close to the center, including support layer 26, are subject to small displacements. Accordingly, when support layer 26 has a relative thickness in the above-mentioned range, benefits are obtained including converting a greater amount of strain energy into vibrations, rather than absorbing the strain energy. Thus, a support layer having an appropriate thickness increases electric energy generated per cycle of vibration and hence may improve the conversion efficiency.

In conventional constructions, energy input to vibrating arm 21 by a movable member, such as a rotating weight applying impact to a piezoelectric transducer damages the transducer. Additionally, since piezoelectric transducers are typically made of ceramic-base materials, the impact directly applied to the vibrating arm is desirably as small as possible. Based thereon, piezoelectric power generator 20 is advantageous in that support layer 26 may be made of a hard to break material such as metal and mechanical energy may be input to vibrating arm 21 through support layer 26. It is also possible to employ conductive support layer 26 for electrical connection with the piezoelectric portions disposed on both sides thereof. To prevent problems caused by the impact, weight 25 is attached to the arm tip end of vibrating arm 21 and driving system 11 applies an impact against weight 25 so that the impact will not directly be applied to the piezoelectric portions.

Moreover, each piezoelectric portion 22a and 22b is constructed by laminating three piezoelectric layers 30a, 30b and 30c and, as a result, are connected in parallel through electrodes 31. Accordingly, each piezoelectric portion 22a and 22b has three electrode surfaces and hence a capacitance nine times as large as the case with no lamination of the piezoelectric layers. At the same time, the electromotive voltage in the open condition is reduced by a third. Further, since laminating the piezoelectric layers contributes to increasing the thickness of the piezoelectric portions, the relative thickness of the support layer may be decreased. Moreover, the directions of polarization $Y_1$, $Y_2$ of piezoelectric portions 22a and 22b are opposite to each other, and piezoelectric portions 22a and 22b are connected in series through support layer 26. As a result, the electromotive voltage of vibrating arm 21 is twice that in the case of the piezoelectric portions having the same direction of polarization.

In a power generator using a piezoelectric transducer, electric energy generated upon application of a strain to the piezoelectric transducer is determined solely by the electromechanical coupling coefficient when it is not used for charging. Stated otherwise, piezoelectric transducers generate the same amount of electric energy from the same input energy if they have the same electro-mechanical coupling coefficient. The electric energy stored in an electric condensing circuit, such as a condenser, through charging, is a function of (1) the electromotive voltage and capacitance of the piezoelectric transducer, (2) the voltage of the electric condensing circuit (e.g. a condenser) and (3) the electromechanical coupling coefficient. For example, a system having an electric condensing circuit may not be charged by using a power generator having a large capacitance, but by one having an electromotive voltage lower than the electric condensing circuit. On the other hand, if a power generator has a capacitance infinitely close to zero, but an electromotive voltage close to infinity is employed, no appreciable charges are produced and the amount of charging is so small that the system including the electric condensing circuit may not be charged. It is therefore important to find optimum values of the electromotive voltage and the capacitance for charging between the above two extreme conditions.

Based on these theoretical parameters, the amount of charging is maximized when the electromotive voltage of the power generator using a piezoelectric transducer is about twice the voltage of the electric condensing circuit. For example, when charging is made in a system of 2 V in which the voltage of condenser 5 shown in FIG. 1 is 1.5 V and the voltage loss of the diodes used in the rectifying circuit is 0.5 V, it is desirable for the power generator to have an electromotive voltage of 4 V. Further, in a power generator using a vibrating arm, the electromotive voltage produced by initial vibration is maximum and then gradually reduced as the vibrations attenuate. Accordingly, the initial electromotive voltage is desirably set so as to provide the maximum amount of charging as disclosed in FIG. 6.

Figure 6:
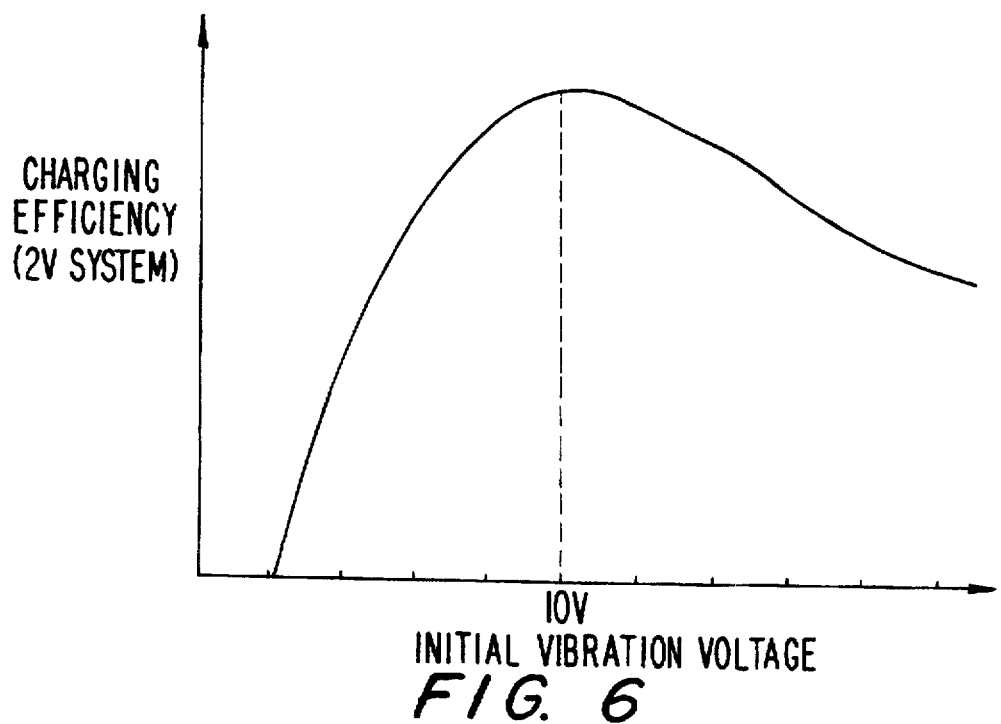
FIG. 6 is a graphical representation showing change in the charging efficiency relative to the initial vibration voltage.
Figure 7:
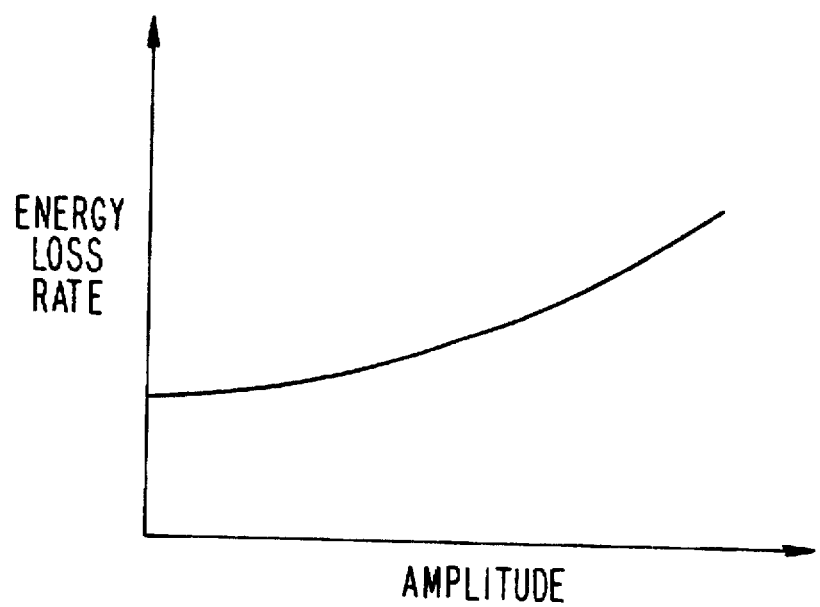
FIG. 7 is a graphical representation showing change in the energy loss rate relative to the amplitude in the piezoelectric power generator.

FIG. 6 is a graph showing the relationship between charging efficiency and the initial vibration voltage when a 2V charging system is charged. As shown, the power generator is desirably set so as to provide an initial vibration voltage of 10 V. Thus, in order to increase the current generating capability of any power generator having the same capability of accumulating electric energy, a large capacitance having an appropriate initial electromotive voltage is required. Further, a high initial electromotive voltage may be obtained by increasing the initial displacement of the vibrating arm. However, as shown in FIG. 7, the larger this amplitude, the greater the vibration energy loss rate and, therefore, the smaller the total amount of charging. Accordingly, it is desirable that the power generator have an appropriate initial electromotive voltage, while keeping the amplitude as small as possible.

In the power generator using vibrating arm 21, piezoelectric portions 22a and 22b are formed with a laminated structure to increase the capacitance to produce a large output current. Further, piezoelectric portions 22a and 22b are connected in series to hold a high initial electromotive voltage so that the predetermined initial electromotive voltage may be obtained even with a small amplitude. In other words, by employing the laminated structure, values of the capacitance and the electromotive voltage may be optimized. As a result, a piezoelectric power generator having increased conversion efficiency and high charging performance may be realized.

While the embodiment of FIG. 3 discloses a laminated structure having three layers, the number of laminated layers may be modified based on the voltage of the electric condensing circuit, the size and displacement of the vibrating arm, and the like so as to provide the power generator having the piezoelectric portions which have an optimum structure for charging. Further, power generator 20 allows the capacitance of the piezoelectric portions to be changed and optimized without modifying the size of vibrating aim 21. As explained above, the number of laminated layers or the capacitance is a matter of design choice to provide an optimum structure by controlling the various factors such as the size, method of the input mechanism and the voltage of the charging circuit. At the same time, a portable electronic device is limited by the size of its power generating section, therefore it is difficult to modify the size of the power generating section to adjust the capacitance. However, these problems may be solved by employing power generator 20. In addition, the problem that a piezoelectric transducer may have difficulties in taking out a lot of charges because it inherently exhibits a large voltage and a small capacitance, may also be solved.

Further, as shown in FIG. 3, power generator 20 is arranged such that electrodes 31 covering piezoelectric portions 22a and 22b are extended from free end 23 toward support end 24 of vibrating arm 21. Electrodes 31 are terminated in a partially overlapping relation to fixed portion 28 of vibrating arm 21. Electrodes 31 may cover the entire portion of vibrating arm 21. That is, not only over piezoelectric portions 22a and 22b, but also fixed portion 28. However, electrodes 31 are preferably not present on fixed portion 28 for the reasons noted below.

Since vibrating arm 21 is fixed to base plate 12 through fixed portion 28, no strains occur in fixed portion 28 and the piezoelectric portions located in fixed portion 28 will not contribute to the generation of electric power. If electrodes 31 are provided so as to cover even parts of the piezoelectric portions connected to fixed portion 28, these piezoelectric portions will not contribute to the power generation, because the charges would be distributed uselessly resulting in a drop of the electromotive voltage. As a result, only parts of the piezoelectric portions that will contribute to the power generation are preferably covered by electrodes 31 so that the power generator may keep a high voltage without reducing the electromotive voltage. As described above, since power generator 20 may provide a large capacitance and a sufficiently high electromotive voltage, it is possible to diminish displacements of the vibrating arm and to reduce the amplitude of the vibration. Consequently, initial stress caused in the vibrating arm is reduced and piezoelectric power generator has improved durability and stable power generation.

As shown in FIGS. 1 and 3, a portion of electrode 31 exposed to the upper surface of vibrating arm 21 is extended to form a terminal 31a for connection to rectifying circuit 2. Also, a portion of electrode 31 exposed to the lower surface of vibrating arm 21 is held in contact with base plate 12 through which the electrode is connected to a terminal 31b for connection to rectifying circuit 2. Thus, the electric energy generated by the piezoelectric portions passes through output leads extending from vibrating arm 21, which is subjected to less vibrations from the piezoelectric portions (i.e., on the side of support end 24 opposite to free end 23, toward fixed portion 28). If the lead wires are connected to vibrating parts of the piezoelectric portions, vibration leakage would probably occur through the leads. By passing the generated electric power from the side of support end 24 toward fixed portion 28, the vibration leakage caused by the output leads may be substantially prevented.

Piezoelectric portions 22a and 22b on both sides of support layer 26 are formed by depositing laminated layers on support layer 26 by means of vapor deposition or sputtering. Accordingly, unlike a power generator wherein the piezoelectric portions are attached to support layer 26 by using an adhesive or the like, the power generator of the invention may avoid the common disadvantages of adhesives. The use of an adhesive, based in part on its thickness and hardness, serves as a buffer member to reduce the strain applied to the piezoelectric portions and produces energy loss therein. Therefore, a strain of the support layer is efficiently transmitted to the piezoelectric portions to improve in the conversion efficiency. Additionally, because there are no differences in adhesion strength and position shifts by attaching the piezoelectric elements to the vibrating arm in the invention, the vibrating arm has (1) good symmetry, (2) a mass-producible small self-attenuation rate and (3) increased cost efficiency.

The driving system for applying an initial displacement to the vibrating arm is not limited to the system using the rotating weight described above. In fact, the driving system has no particular limitations so long as it may apply strain energy to the vibrating arm of the power generator, and may be of any shape (e.g., a spring, a swing member using a spring, a pendulum, or a hammer). As a result, it is desirable to form a driving system as small and light as possible to be suitable for use in portable devices.

Figure 8:
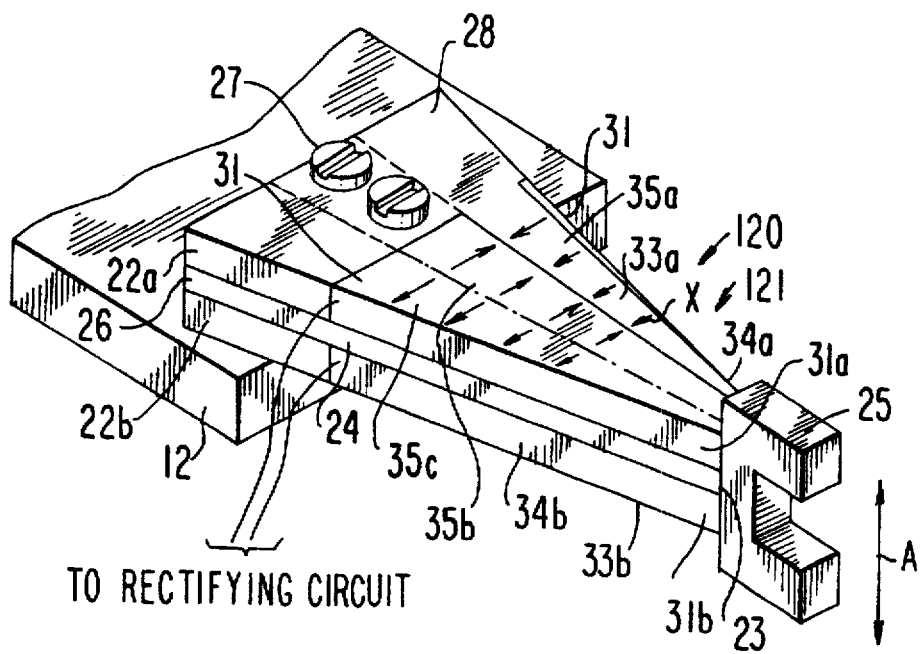
FIG. 8 is a perspective view of a power generator constructed in accordance with a second embodiment of the invention.

Reference is now made to FIG. 8, which discloses a second embodiment of the invention, generally indicated as 120. Like numbers are used to denote like parts from the first embodiment, the primary difference being the orientation of polarization in the vibrating aim. Vibrating arm 121 of piezoelectric power generator 120 of this embodiment is also a bimoiph type. Piezoelectric portions 122a and 122b are disposed on both sides of a support layer 26. Piezoelectric portions 122a and 122b have polarization directions indicated by arrows X and are aligned in the widthwise direction of vibrating arm 121 and substantially perpendicular to the directions of vibrations indicated by arrow A. Accordingly, a voltage is produced in the direction toward left and right lateral surfaces 34a and 34b of vibrating aim 121, while a voltage is produced in the direction toward upper and lower surfaces 33a and 33b of vibrating arm 121 in the first embodiment. Therefore, electrodes 31a and 31b for connection to the rectifying circuit are provided on one lateral surface 34b, and an electrode for connecting piezoelectric portions 122a and 122b in series is provided on the other lateral side 34a (not shown). Electric power is generated by utilizing the transverse effect of a piezoelectric transducer, because the direction of propagation of the elastic waves occurred with vibrations perpendicular to the direction of generated voltage.

Piezoelectric portions 122a and 122b of vibrating arm 121 each comprise three layers 35a, 35b and 35c similar to the first embodiment. However, since each piezoelectric portion is polarized in the widthwise direction (i.e., the left-and-right direction of vibrating arm 121), each layer 35a, 35b and 35c is laminated in the left-and-right direction perpendicular to the directions of vibrations indicated by double-headed arrow A, whereas the three layers are laminated in the vertical direction, the directions of vibration of arrow A in the first embodiment. Layers 35a, 35b and 35c are connected in parallel through electrodes 31. Further, the directions of polarization of piezoelectric portions 122a and 122b are opposite to each other and piezoelectric portions 122a and 122b are connected in series through electrode 31 similarly to the first embodiment.

Thus, piezoelectric power generator 120 effectively converts the strain energy of vibrating arm 121 into electric energy with high conversion efficiency, because piezoelectric portions 122a and 122b are extended to a root portion of the vibrating arm 121 as with the first embodiment. Also, since piezoelectric portions 122a and 122b are each of the laminated structure, the capacitance and the electromotive voltage may easily be optimized and the electric condensing circuit may efficiently be charged. Further, since electrodes 31 are disposed in only parts of the piezoelectric portions which will actually contribute to the power generation, the electromotive voltage may be kept sufficiently high and a satisfactory level of electric power may be ensured with a small amplitude.

Figure 9:
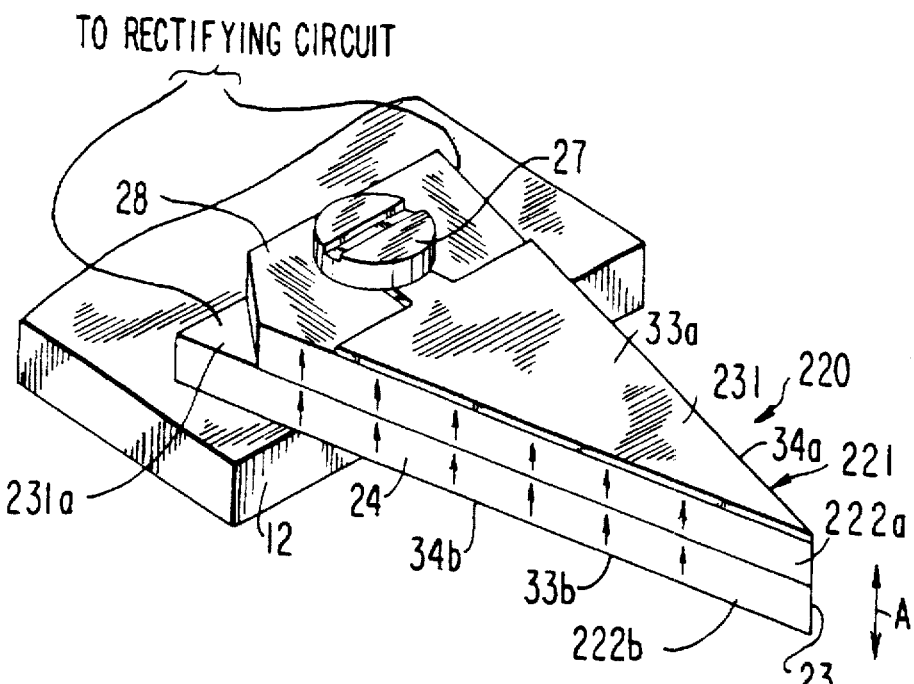
FIG. 9 is a perspective view of a power generator constructed in accordance with a third embodiment of the invention.

Referring now to FIG. 9, a piezoelectric power generator, generally indicated as 220, according to still another embodiment of the invention. Like numbers are used to denote like parts, the primary difference being the removal of the weight and support layer.

Piezoelectric power generator 220 of this embodiment includes a substantially triangular vibrating arm 221, which is constructed by joining two layers of piezoelectric portions 222a and 222b to each other. Piezoelectric portions 222a and 222b are each polarized in the same direction as the vibrations represented by the upward arrow of double-sided arrow A (i.e., in the upward direction). As a result, a potential having the same polarity is produced in each of upper and lower surfaces 33a and 33b of vibrating arm 221. Therefore, piezoelectric portions 222a and 222b are connected in parallel through an electrode 231a, which is provided as the interface between piezoelectric portions 222a and 222b. Accordingly, lead wires for supplying generated electric power to the rectifying circuit therethrough is connected to electrode 231a provided at the interface between piezoelectric portions 222a and 222b. Further, electrodes 231 are provided on upper and lower surfaces 33a and 33b of piezoelectric portions 222a and 222b. Electrodes 231 are electrically connected to a screw 27 by which vibrating arm 221 is fixed to base plate 12, thereby connecting electrodes 231 on upper and lower surfaces 33a and 33b to each other. The generated electric power is supplied to the rectifying circuit through base plate 12.

Electric power is then generated by effectively utilizing a root portion of vibrating arm 221, which undergoes maximum strain energy resulting in high conversion efficiency as with the previous embodiments. Also, since each of the piezoelectric portions (i.e., each of the sides compressed and tensioned upon vibrations) is formed of a piezoelectric material alone, the total amount of strain energy applied to the piezoelectric transducer per cycle of vibration is increased as compared to a piezoelectric transducer of unimorph type (wherein one piezoelectric layer is joined to a support layer of metal or the like). Consequently, the power generator of this embodiment has a structure capable of easily realizing an efficient piezoelectric power generator which may convert a greater amount of mechanical energy into electric energy per cycle of vibration.

Further, since piezoelectric portions 222a and 222b may be formed by depositing piezoelectric layers on both sides of electrode 231a by sputtering or the like without bonding them to each other using an adhesive, energy loss caused by an adhesive layer may be prevented and the conversion efficiency may be improved. Additionally, because there are no differences in adhesion strength and position shifts by attaching the piezoelectric elements to the vibrating arm, a vibrating arm having a small self-attenuation rate may be mass-produced inexpensively.

As a result of this construction, when a sufficiently high level of electromotive voltage is produced from the characteristics of the piezoelectric transducers making up the piezoelectric portions and a charging voltage of the electric condensing circuit is low, a piezoelectric power generator may be formed capable of producing a satisfactory electromotive voltage without attaching any weight at free end 23 of vibrating arm 221. Further, by not requiring a large generated current, a satisfactory capacitance may be ensured by connecting piezoelectric portions 22a and 22b in parallel with no need of laminating the piezoelectric layers.

Figure 10:
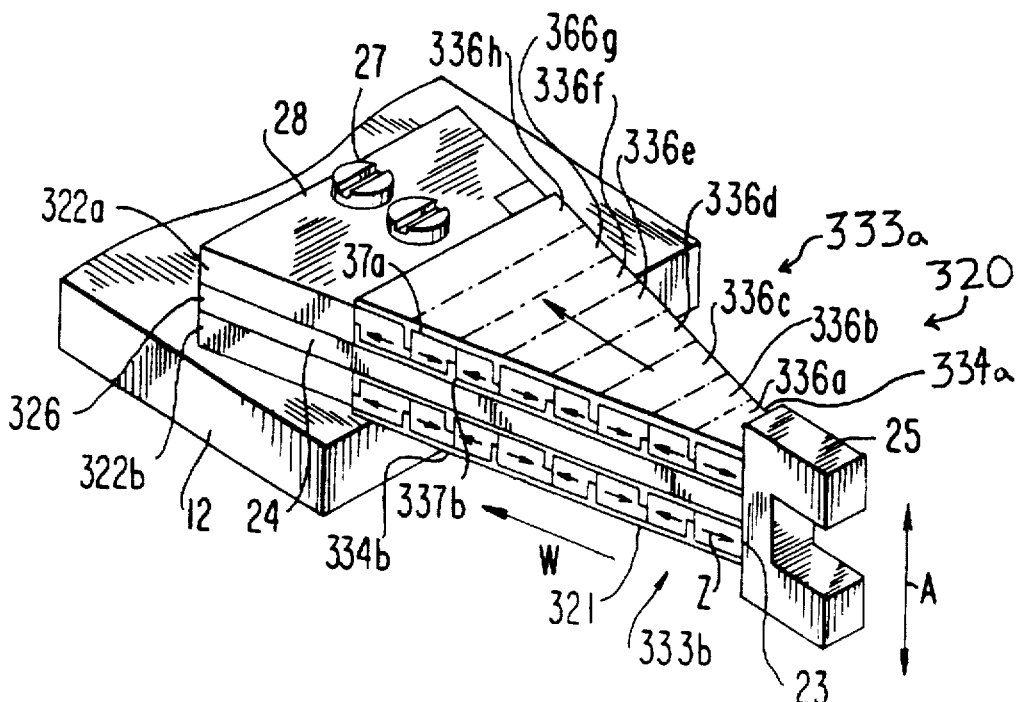
FIG. 10 is a perspective view of a power generator constructed in accordance with a fourth embodiment of the invention.

Referring now to FIG. 10, a piezoelectric power generator using a vibrating arm, generally indicated at 320, according to still another embodiment of the invention is disclosed. Vibrating arm 321 in piezoelectric power generator 320 of this embodiment is of bimorph type similar to the first embodiment, the primary differences being the orientation of piezoelectric layers and the formation of the electrodes. Parts common to the first embodiment are denoted by the same reference numerals and will not be described below.

In vibrating arm 321 of this embodiment, piezoelectric portion 322a and 322b, disposed on both sides of a support layer 326, comprise eight piezoelectric layers 336a to 336h laminated in a direction from free end 23 to a support end 24 of vibrating arm 321. Piezoelectric layers 336a to 336h have directions of polarization indicated by arrow Z aligned with the direction interconnecting free end 23 and support end 24 of vibrating arm 321 and are substantially perpendicular to the direction of vibration indicated by double-headed arrow A. Accordingly, a voltage is produced in the direction toward free end 23 and support end 24. Piezoelectric layers 336a to 336h are connected in parallel through electrodes 337a and 337b alternately projecting downwardly and upwardly in the form of comb teeth. Then, the directions of polarization W of piezoelectric portions 322a and 322b set such that generated potentials are opposite to each other. Piezoelectric portions 322a and 322b are connected in series through conductive support layer 326.

Vibrating arm 321 of this embodiment also vibrates in the vertical directions indicated by arrow A as with the vibrating arms of the previous embodiments. Therefore, piezoelectric portions 322a and 322b produce elastic waves propagating in the direction to interconnect free end 23 and support end 24. Since the direction of polarization representing the direction of generated voltage is also aligned with the direction interconnecting free end 23 and support end 24, power generator 320 of this embodiment may generate electric power by utilizing the longitudinal effect of the piezoelectric transducers. The electromechanical coupling coefficient resulting from the longitudinal effect is approximately three times as large as when utilizing the transverse effect. Therefore, the conversion efficiency of power generator 320 of this embodiment may be greatly increased.

Although it is possible to employ a single-layer piezoelectric portion for power generation utilizing the longitudinal effect, the use of a single-layer piezoelectric portion would result in a very long distance between electrodes and a too small capacitance to produce the required charges. Further, despite an improvement in the conversion efficiency, there is a difficulty in realizing a piezoelectric power generator practical for charging. By contrast, in the power generator of this embodiment, since the electromotive voltage and the capacitance are optimized by employing the laminated structure, electric energy produced per cycle of vibration is increased and charging may effectively be performed with high conversion efficiency.

As with the previous embodiments, the piezoelectric portions are extended to a root portion of vibrating arm 321 so that strain energy in the root portion of vibrating arm 321 may also efficiently be converted into electric energy. Further, since piezoelectric portions 322a and 322b each have a laminated structure, the electromotive voltage and the capacitance may easily be optimized. Thus, power generator 320 of this embodiment provides advantages similar to those with the previous embodiments. In addition, a piezoelectric power generator having very high conversion efficiency by utilization of the longitudinal effect may be realized, because the piezoelectric layers are laminated in the direction from the free end toward the support end of the vibrating arm. However, the piezoelectric layers may not be continuously formed from the free end to the fixed portion beyond the support end of the vibrating arm.

Figure 11:
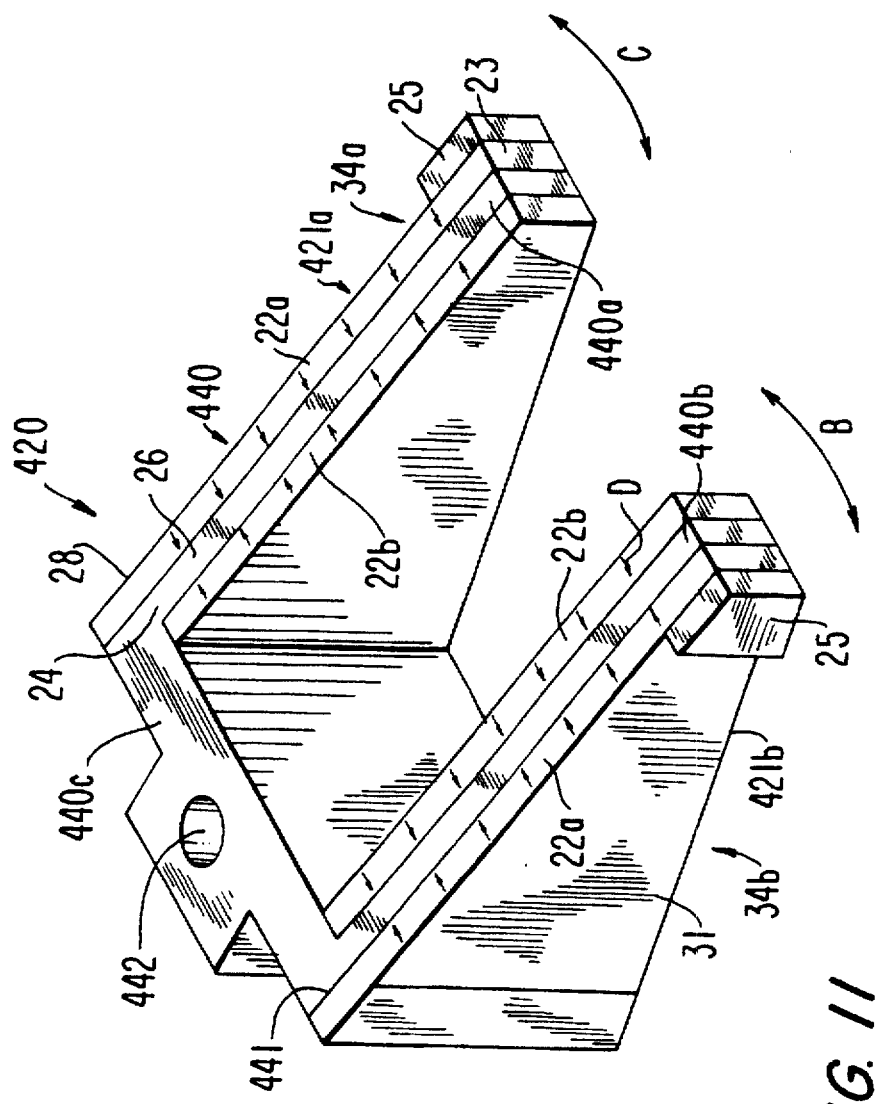
FIG. 11 is a perspective view of a power generator constructed in accordance with a fifth embodiment of the invention.

FIG. 11 discloses a piezoelectric power generator using a vibrating member, generally indicated as 420, according to still another embodiment of the invention. In the piezoelectric power generator of this embodiment, electric power is generated by using a vibrating member 440 formed by coupling two vibrating arms 421a and 421b, each of which may be the same as used in the previous embodiments.

Efficiency of converting strain energy into electric energy by using the vibrating arm provided with the piezoelectric portions will now be discussed in greater detail. Even though no electric energy is taken out from vibrating arm 421, vibrations of vibrating arm 421 are gradually attenuated due to self-loss occurring within the vibrating arm itself and vibration leakage through a fixed portion at which the vibrating arm is fixed (hereinafter "self-attenuation"). Here, the attenuation rate of the strain energy due to the self-attenuation per cycle of vibration is assumed to be a certain percentage "a". Since vibrations of the vibrating arm brings about conversion of strain energy into electric energy through the piezoelectric portions, the strain energy is also attenuated in an amount corresponding to the electric energy taken out. This attenuation rate of the strain energy is assumed to be a certain percentage "b".

In other words, vibration per cycle is the strain energy of "a+b" lost due to the self-attenuation and the conversion into electric energy, while electric energy of "b" percent is produced. Accordingly, the efficiency of conversion into electric energy is expressed by b/(a+b). Thus, if the vibrating arm has no self-attenuation, one hundred percent of the strain energy could be converted into electric energy. By keeping the self-attenuation as small as possible, the conversion efficiency is improved. Alternatively, piezoelectric power generator 420 may be constructed with piezoelectric power generator 220 of FIG. 9.

Figure 12:
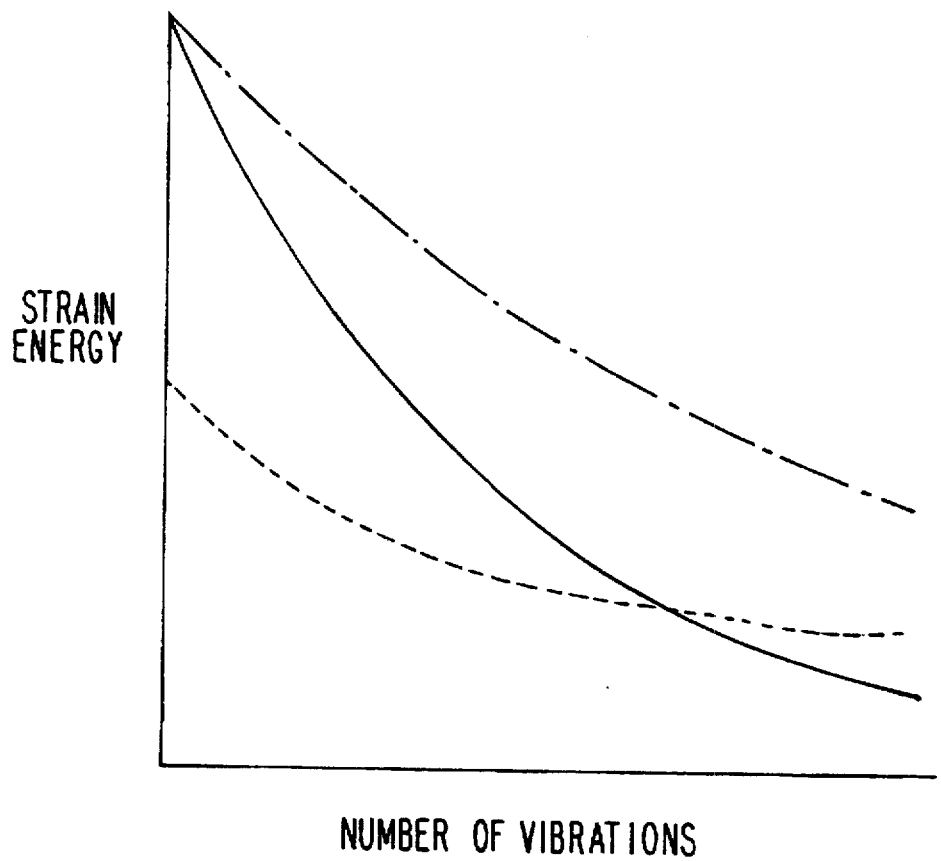
FIG. 12 is a graphical representation showing self-attenuation of strain energy in the vibrating arm relative to number of vibrations for each of the different structures.

Referring to FIG. 12, a graph is provided for disclosing the values of self-attenuation of the strain energy depending on the different structures of vibrating members. A solid line represents the attenuation of the strain energy when the vibrating arm of a multilayered beam type disclosed above is displaced and then freely vibrated. In the multilayered beam, as the number of vibrations increases, the strain energy is steadily reduced by an amount proportional to the square of the amplitude under free vibration. On the other hand, a broken line represents attenuation of the strain energy when normal vibrations are applied to a vibrating member of a tuning-fork type. As shown in FIG. 12, if only one beam of the tuning fork is displaced in one direction, just less than half the input energy is employed to develop vibration in a tuning fork mode in which two vibrating arms are vibrated in opposite directions and, therefore, initial strain energy is reduced down to less than half that obtainable with the multilayered beam.

A one-dot-chain line in FIG. 12 represents the attenuation of the strain energy when vibrating arms 421a and 421b are combined to form the tuning fork displaced in opposite directions as shown in FIG. 11. By displacing vibrating arms 421a and 421b in opposite directions, all the input energy is converted into vibrations in the tuning fork mode to enable the vibrating arms to be vibrated in the tuning-fork vibration mode from the beginning. By combining the two vibrating arms into the form of a tuning fork, the self-attenuation is maintained very small from the initial stage and the overall self-attenuation of the strain energy in the piezoelectric power generator is considerably reduced. Consequently, the conversion efficiency from strain energy into electric energy may further be improved.

Referring back to FIG. 11, vibrating member 440 includes a channel-shaped support member 441 comprising elongated portions 440a and 440b extending parallel to each other and a bottom portion 440c interconnecting ends of the elongate portions 440a and 440b. Vibrating arms 421a and 421b are constructed by using parallel elongated portions 440a and 440b of support member 441 as respective support layers. Accordingly, vibrating arms 421a and 421b are combined by coupling portion 440c into the form of a tuning fork so that vibrating member 440 may excite vibrations in the tuning fork mode. A hole 442 is bored through coupling portion 440c at essentially its center. Vibrating member 440 is then fixed to a base plate or the like by a screw.

Vibrating arms 421a and 421b may be formed from any of the vibrating arms described above. In FIG. 11, by way of example, vibrating arms 421a and 421b have the same structure as the vibrating arm explained in connection with the first embodiment of FIG. 4; and therefore, like parts are denoted with the numbers. However, since vibrating arms 421a and 421b are not separately displaced, a weight 25 is attached to a free end 23 of each vibrating arm. Weight 25 has a different shape from that described in the previous embodiments and is positioned on outer lateral surfaces of tuning-fork type vibrating member 440 so that it may receive an impact from the outside. Piezoelectric portions 422a and 422b extend from free end 23 to a support end 24 of the vibrating arm to enable electric power to be efficiently generated in a root portion of the vibrating arm to produce large strain energy.

Further, piezoelectric portions 22b, positioned on the inner side of vibrating arms 421a and 421b, are combined into the form of a tuning fork. Piezoelectric portions 422b extend to coupling portion 440c of the channel-shaped support member 440, which corresponds to the fixed portion in the aforesaid vibrating arm, thereby preventing such trouble as peeling-off due to concentration of stresses on the piezoelectric portions. On the other hand, electrodes 31 are formed so as to cover vibrating parts of piezoelectric portions 422a and 422b to support end 24, not including coupling portion 440c. In this manner, the electromotive voltage is prevented from dropping due to charges distributing into parts of the piezoelectric portions which will not contribute to the power generation.

The positions and configurations of electrode 31 are not limited to those shown in FIG. 11, but may be disposed on surfaces 34a or 34b of vibrating arms 421a and 421b depending on the directions of polarization of piezoelectric portions 422a and 422b. For example, when the direction of polarization of piezoelectric portions 422a and 422b are oriented with respect to the directions of vibration as shown by double-headed arrow A with the vibrating arm of the embodiment of FIG. 8, different from the embodiment of FIG. 11, as shown by the polarization arrows D and vibration arrows B, C, electrodes are provided so as to extend following the channel-like shape of support member 440. The electrodes may have the same configuration on the front and rear sides of support member 440, or may be modified, for example, such that the electrode on the rear side is formed as a full-surface electrode. In this case, only two surface electrodes are connected to the rectifying circuit and, therefore, the manufacture is facilitated compared to the case of connecting four electrodes having the same configuration on the front and rear surfaces of the vibrating arms. Also, since piezoelectric portions 422a and 422b are connected in series, a large voltage may be produced with a small strain.

Further, vibrating arms 421a and 421b are typically triangular or trapezoidal in shape. Based on this construction, the arm is relatively narrow on the side of free end 23 and relatively wide on the side of support end 24 (i.e., the root portion) to enable strain energy to be converted into electric energy with high conversion efficiency similar to the previous embodiments. Though not shown in detail, piezoelectric portions 422a and 422b may be formed with a laminated structure having multiple layers to obtain advantages similar to those obtainable with the embodiment of FIG. 1. Vibrating arms 421a and 421b, combined to form of a tuning fork, may be connected in series or in parallel as desired. In FIG. 11, channel-shaped support member 441 has conductivity and serves to connect piezoelectric portions 422a and 422b of each vibrating arm in series at an intermediate potential. Then, vibrating arms 421a and 421b are connected in parallel as a whole. Consequently, a piezoelectric power generator having an even larger capacitance may be provided.

Piezoelectric portions 422a and 422b are formed by any applicable techniques (e.g., sputtering) that require no bonding of the piezoelectric transducers to support member 440. By forming the piezoelectric portions in this manner, the differences in adhesion strength and position shifts are avoided in the structure because self-attenuation is affected by the symmetry of the design. Also, the factors that cause variations in thickness and width of each vibrating arm are reduced, because the piezoelectric portions may be molded by using a one-piece mold. As a result, the self-attenuation rate may be stabilized in mass production and cost efficiency may be improved.

As discussed with respect to FIG. 12, it is important that vibrating arms 421a and 421b of FIG. 11 be displaced in opposite directions. If a displacement is applied to only one arm, the vibrating member would vibrate in the tuning-fork vibration mode with nearly half the amount of input energy and hence the merit of the tuning-fork having small self-attenuation could not be developed.

Figure 13:
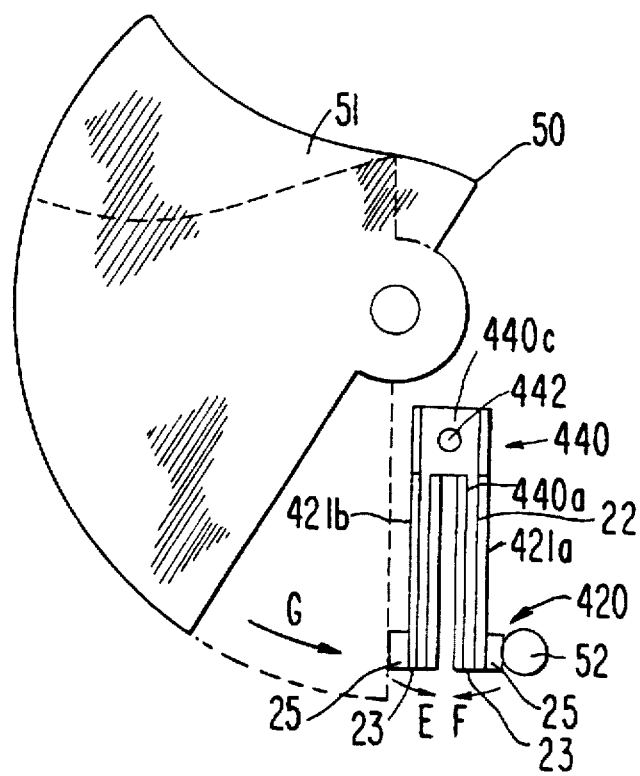
FIG. 13 is a top plan view showing a vibration applying mechanism for imparting displacements to the vibrating arms constructed in accordance with an embodiment of the invention.

A vibration mechanism for applying displacements to vibrating arms 421a and 421b in opposite directions is shown in FIG. 13. A vibration applying mechanism 50 includes a rotating weight 51 rotatable within a case for use in a wrist watch or the like. A wall 52 is further provided for bearing vibrating member 40 from the side opposite to rotating weight 51. Tuning fork-type vibrating member 440 is sandwiched between rotating weight 51 and wall 52 so that vibrating arms 421a and 421b are displaced in opposite directions indicated by arrows E, F to vibrate in the tuning-fork vibration mode. When rotating weight 51 is rotated downwardly in the direction of arrow G or counterclockwise in FIG. 13, one side of rotating weight 51 hits against weight 25 at the tip end of left-hand vibrating arm 421b. Weight 25 at the tip end of vibrating arm 21a on the opposite side thereby strikes against wall 52 allowing both rotating anus 421a and 421b to be displaced inwardly at substantially at the same time. When rotating weight 51 is returned upwardly or clockwise and free ends 23 of rotating arms 421a and 421b are released from the impact, the arms start to vibrate freely in the tuning-fork vibration mode. Accordingly, the self-attenuation of vibrations of rotating arms 421a and 421b is very small and strain energy is not wasted. As a result, strain energy may efficiently be converted into electric energy. When the position of a portable electronic device is changed to cause rotating weight 51 to again strike vibrating member 440, vibrating member 440 is sandwiched between rotating weight 51 and wall 52 to repeatedly cause strains in opposite directions. Therefore, strain energy is input to vibrating arms 421a and 421b of vibrating member 440, thereby continuously generating electric power.

As an alternative, channel-shaped support member 40 may be attached to the base plate in a rotatable manner with a stop for preventing the rotation of rotating weight 51 positioned between vibrating arms 421a and 421b. While rotating weight 51 is arranged so as to hit against vibrating arms 421a and 421b, the vibration applying mechanism may be constructed such that rotating weight 51 hits against vibrating arms 421a and 421b from both sides for displacing the arms in opposite directions. In this case, the rotation stop is required to be located in the vicinity of both the vibrating arms at a position out of interference with the hitting motion of rotating weight 51. Still another alternative construction involves incorporating piezoelectric generators 220 of FIG. 9 in vibrating member 440.

Figure 14:
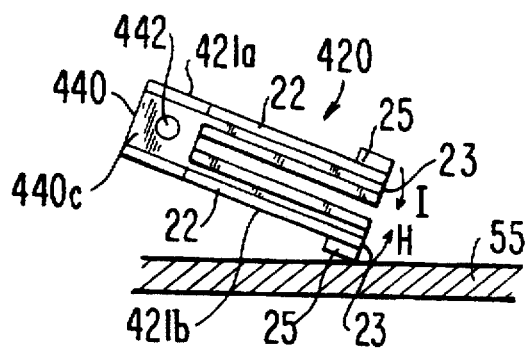
FIG. 14 is a side elevational view of a vibration applying mechanism for imparting displacements constructed in accordance with another embodiment of the invention.

Reference is now made to FIG. 14 which discloses another embodiment of a vibration applying mechanism. Like structures are indicated by like numbers, the primary difference being that the vibrating member is pivotable within the case.

Tuning-fork type vibrating member 440 is attached in a pivotable manner, like a pendulum, about a pivot point 442. A wall 55 is provided such that when rotating member 440 is rotated in one direction, weight 25 at free end 23 of one of rotating arms 421a and 421b strikes against wall 55. When free end 23 of one rotating arm strikes against the wall 55, free end 23 is displaced inwardly. At the same time, free end 23 of the other rotating arm is also displaced inwardly by virtue of inertia due to its own weight. Accordingly, free ends 23 of rotating arms 421a and 421b are both displaced inwardly (i.e., in opposite directions as indicated by arrows H and I) causing the arms to vibrate in the tuning-fork vibration mode. Wall 55 against which vibrating member 440 strikes may be provided near one of the vibrating arms or may be provided outwardly of each vibrating arm so that both vibrating arms strike against the respective walls to excite vibrations successively. Further, vibrating member 440 may be arranged to pivot or drop by the force of gravity or to pivot depending on motion of the user as with the aforementioned rotating weight 51 for use in a wrist watch.

Figure 15:
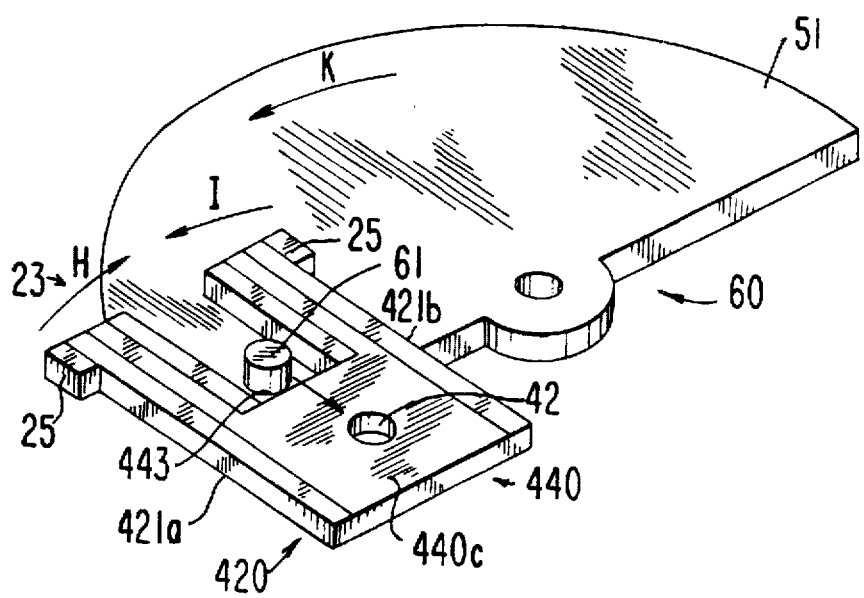
FIG. 15 is a perspective view of a vibration applying mechanism for imparting displacements to the vibrating arms constructed in accordance with still another embodiment of the invention.

Reference is now made to FIG. 15 in which another embodiment of the invention, generally indicated as 520, is provided. Like numbers are used to indicate like structure, the primary difference being the use of a vibration applying mechanism.

A vibration applying mechanism 60 is intended to apply a hit to a crotch portion 443 of tuning-fork type vibrating member for displacing vibrating arms 421a and 421b in opposite directions. A projection 61 is provided on an outer peripheral portion of rotating weight 51 and member 440 is arranged such that, when rotating weight 51 is rotated, projection 61 strikes subs vibrating tantially against the center of coupling portion 440c of the channel-shaped support member 440. Based thereon, upon rotation of rotating weight 51 in the direction of arrow K, an impact is applied to both vibrating arms 421a and 421b causing free ends 23 of vibrating arms 421a and 421b to displace inwardly in the direction of arrows H, I. As a result, the arms start vibrations in the tuning-fork vibration mode with less attenuation.

Figure 16:
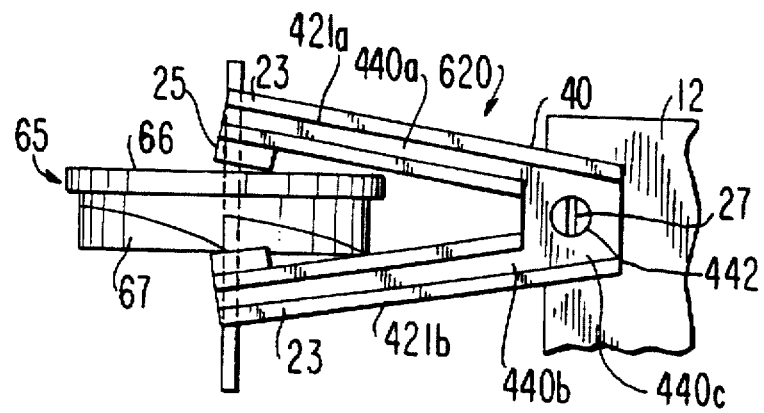
FIG. 16 is a side elevational view of a vibration applying mechanism for imparting displacements to the vibrating arms constructed in accordance with still yet another embodiment of the invention.
Figure 17:
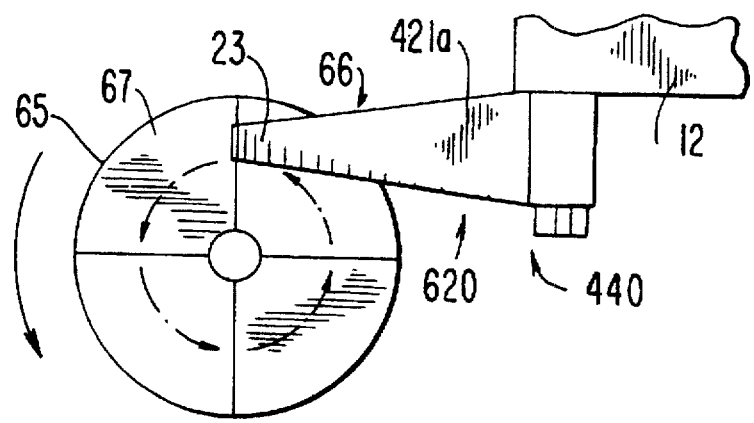
FIG. 17 is a bottom plan view of the embodiment of FIG. 16(a).

Reference is made to FIG. 16, a side elevational view showing still another embodiment of the piezoelectric generator, generally indicated as 620, and FIG. 17, a bottom view of the piezoelectric generator 620. Like numerals are utilized to indicate like structure, the primary difference being the use of a disk as the vibration applying mechanism.

A vibration applying mechanism 65 includes a disk 66. A surface of disk 66 is provided with slopes 67 inclined intermittently or stepwisely. More specifically, slopes 67 are defined by moderate slopes gradually inclining from a high level to a low level as indicated by arrows of one-dot-chain lines in FIG. 17, and steps or steep slopes abruptly inclining from a high level to a low level and located at the boundary between the moderate slopes.

Disk 66 is rotated between vibrating arms 421a and 421b so that free end 23 of one of vibrating arms 421a and 421b is moved along moderate slope 67 from the low level to the high level, thereby increasing the distance between free ends 23. When free end 23 then pushes over the top of moderate slope 67, it is abruptly shifted from the high level to the level at the step or steep slope on disk 66, whereupon vibrating arms 421a and 421b are simultaneously displaced inwardly to start vibrating in the tuning-fork vibration mode. If disk 66 or vibrating member 440 is fixed so as to vertically move a little, vibrating arms 421a and 421b may be displaced in a similar fashion. Since more uniform vibrations may be developed in vibrating arms 421a and 421b, the vibration mode provides higher conversion efficiency with less attenuation. Disk 66 may be arranged so as to use rotational energy of rotating weight 51 for use in a wrist watch or the like. In such a design, rather than a disk provided with the slopes, vibrating arms 421a and 421b may be moved so as to intermittently displace up and down following the slopes. Alternatively, vibrating member 40 may be formed with piezoelectric power generator 220 of FIG. 9.

In the power generator using a piezoelectric member of the invention, the piezoelectric member is extended to a root portion of the vibrating arm and the percentage of cross-sectional area of a support layer, such as a spring-like lever, is restricted within a predetermined range for enabling strain energy to be effectively utilized for power generation. More specifically, the piezoelectric power generator of the invention comprises at least two piezoelectric portions laminated with a support layer therebetween. Electrodes are provided and cover at least parts of surfaces of the piezoelectric portions. A power generating section is provided for outputting an alternating current through the electrodes. The power generating section is formed on at least the side of a support end of a vibrating arm which has a free end being able to freely vibrate and the support end for supporting the free end.

In this arrangement, the cross-sectional area of the support layer in the power generating section is set to be less than or equal to about 60% of the total thickness of the power generating section. The piezoelectric portions may be laminated directly or with the support layer therebetween. In this arrangement, the piezoelectric portions are provided on the side of the support end of the vibrating arm, (i.e., in the root portion) which undergoes a maximum strain and through which strain energy is liable to leak. In this manner, the strain energy in the root portion may efficiently be transmitted to the piezoelectric portions for conversion into electric energy. If the majority of the strain energy is concentrated into the support layer, such as a spring-like lever, it is difficult to recover the concentrated strain energy for conversion into electric energy. For this reason, the percentage of cross-sectional area of the support layer in the power generating section is maintained within a range (disclosed below) capable of providing high conversion efficiency based.

In a vibrating arm having a sandwich structure comprising the piezoelectric portions on both sides of a thin support layer, the amount of strain energy transmitted to the support layer may be reduced. Also, since the support layer may serve as an impacted surface to which input energy is applied, a direct impact upon the piezoelectric portions may be avoided and a power generator having high reliability may be realized. Further, problems associated with impacts may be prevented by attaching a weight to a tip of the free end of the vibrating arm and applying a hit against the weight to enable it to freely vibrate. By employing a sandwich structure including a support layer, the support layer may be used as an electric path for the piezoelectric portions. Therefore the piezoelectric portions may be connected in series or in parallel through the support layer. Alternatively, the support layer may be employed as an electrode for connection to a rectifying device.

In the preferred embodiments, the vibrating arm is formed having a substantially triangular or trapezoidal shape such that size of the piezoelectric portions in the widthwise direction perpendicular to the direction of vibration of the vibrating arm is wider in the side of the support end than in the side of the free end. Based on this configuration, stresses incurred due to vibrations may be dispersed almost uniformly over the piezoelectric portions resulting in higher conversion efficiency.

When the support end of the vibrating arm is fixed to a stationary member, strain energy produced in the root portion of the vibrating arm may be converted into electric energy, because the piezoelectric portions are provided over a portion at which the vibrating arm is fixed to the stationary member and a portion extending from the fixed portion toward the free end. The electrodes may be provided anywhere on the vibrating arm. However, it is preferable that the electrodes be provided in the extended portion, but not on the fixed portion. By providing the electrodes in the extended portion over which the piezoelectric portions are disposed, the root portion of the vibrating member may be utilized as the power generating section and the strain energy applied to the root portion may be utilized more efficiently. Since the fixed portion of the vibrating arm will not contribute to the power generation, the electrodes do not need to be provided on the fixed portion to prevent charges from dispersing uselessly and suppressing a drop of the electromotive voltage. On the other hand, with the piezoelectric portions extended to the fixed portion, stresses applied to edges of the piezoelectric portions may be alleviated. Specifically, by extending the piezoelectric portions to the fixed portion, the piezoelectric portions cover the entire vibrating arm from the free end to the fixed portion via the support end. As a result, stresses are avoided from locally concentrating on the root side of the piezoelectric portions, and the piezoelectric portions are prevented from breaking.

A power generator is required to generate a higher voltage than that of a charging system. In a power generator using a vibrating arm, a sufficient level of the electromotive voltage is required at the initial stage, because the electromotive voltage is reduced as vibrations attenuate. Accordingly, it is preferable to produce a higher electromotive voltage. To accomplish this requirement, the first and second piezoelectric portions forming the piezoelectric portions may be polarized in opposite directions and connected in series. By polarizing the first and second piezoelectric portions in opposite directions, these two piezoelectric portions are connected in series through the support layer so that a higher electromotive voltage may be obtained from both sides of the vibrating arm. Thus, since a sufficient level of the electromotive voltage is produced even with a small initial displacement of the vibrating arm, it is possible to reduce energy loss due to attenuation of vibrations and to increase the conversion efficiency.

Furthermore, in a power generator, it is important to increase a value of the generated current. Particularly, a power generator using a piezoelectric transducer has more difficulty increasing current than voltage. For this reason, a piezoelectric power generator is preferably arranged so as to increase a current value. In the piezoelectric power generator of the invention, each of the piezoelectric portions comprise a plurality of piezoelectric layers laminated in the direction of polarization, and the piezoelectric layers are connected in parallel with electrodes disposed between the piezoelectric layers. This arrangement increases the electrode area in parts of the piezoelectric portions which will contribute to the power generation, and a sufficient cross-section of each piezoelectric portion may be achieved by laminating a plurality of thin piezoelectric layers. Therefore, a capacitance of the power generating section may be increased and hence a large current value may be realized.

When the piezoelectric portions are polarized in a direction substantially perpendicular to the direction interconnecting the free end and the support end of the vibrating arm, electric power may be generated by utilizing the transverse effect. When the piezoelectric portions are polarized substantially in the direction interconnecting the free end and the support end of the vibrating arm, electric power may be generated by utilizing the longitudinal effect. In particular, by generating electric power by utilization of the longitudinal effect, the power generation is performed with a high coupling coefficient and hence the conversion efficiency is improved.

Moreover, by combining two vibrating arms, each of which has a power generating section, into the form of a tuning fork, a structure is obtained that is superior in continuing vibrations and is effective in reducing attenuation of vibrations and improving the conversion efficiency. To suppress attenuation of vibrations and improve the conversion efficiency, it is preferable to employ a vibration applying mechanism for imparting displacements in opposite directions to the two vibrating arms combined into the form of a tuning fork. By using such a vibration applying mechanism, a vibration from a tuning fork is developed in the vibrating arms.

The vibration applying mechanism may comprise a hitting portion for hitting against the free end of one of the two vibrating arms in a direction toward the other vibrating arm. A wall portion the strikes against the free end of the other vibrating arm strikes when a hit is applied to one vibrating arm. The two vibrating arms, combined into the form of a tuning fork, are vibrated by being sandwiched between the hitting portion and the wall portion. The hitting portion may be moved by a weight which is movable like a pendulum.

In an alternative embodiment, the two vibrating arms may be supported such that their free ends are movable like a pendulum, while the vibration applying mechanism may include a wall portion against which the free end of one of the vibrating arm strikes. With this arrangement, when the vibrating arms are swung externally, displacements in opposite directions are applied to the two vibrating arms which may be thereby vibrated in the tuning-fork vibration mode with less attenuation. Further, by employing another vibration applying mechanism arranged to hit against the center of a coupling member on the side of the support ends, displacements in opposite directions may also be applied to the two vibrating arms. Additionally, by employing still another vibration applying mechanism which includes a vibration applying member having a first portion to widen the distance between the free ends of the two vibrating arms combined into the form of a tuning fork, and a second portion sufficiently thin to pass between the free ends of the two vibrating arms, and by alternately inserting the first and second portions between the free ends of the two vibrating arms, displacements in opposite directions may also be applied to the two vibrating arms.

While the present invention has been described above in connection with several embodiments, the invention is not limited to those embodiments. For example, while several types of the vibrating arms have been illustrated, any of those vibrating arms may be formed into a tuning fork type. In the fork type embodiments, the layers of the piezoelectric portions are formed on both surfaces of the vibrating member, but may be formed on either surface of the vibrating member.

Further, the vibrating arms have been described as being trapezoidal or triangular in shape so that strain energy produced in the root portion of the vibrating arm may efficiently be converted into electric energy, but the arm configuration is not limited to a trapezoid or triangle. In fact, the conversion efficiency may be increased by extending the piezoelectric portions to the root portion of the vibrating arm, or laminating piezoelectric layers in the piezoelectric portions. Further, the piezoelectric layers do not need to be formed by sputtering. Rather, the vibrating arm may be manufactured by using a piezoelectric substance in bulk form. Additionally, materials of the piezoelectric portions are not limited to PZT, but may be quartz, ceramic materials, such as based on barium titanate and lead titanate, or high molecular materials, such as PVDF (Poly Vinylidene Fluoride).

Moreover, the invention is not limited to a wrist watch. The piezoelectric power generator of the invention is also applicable to portable electronic devices, such as, pagers, telephones, wireless units, hearing aids, pedometers, minicalculators, information terminals, such as, electronic pocketbooks, IC cards, and radio receivers. By incorporating the piezoelectric power generator of the invention in those portable devices, an electric condensing device may be charged at all times in conjunction with motion of the user, making it possible to suppress consumption of a battery or eliminate the need of a battery itself. Accordingly, the user may use those portable devices without concern of draining a battery, which is especially critical with data storage devices. Further, even in areas or places where batteries or charging devices are not available, or under conditions where batteries are difficult to replenish due to disasters or the like, the portable electronic devices each having the piezoelectric power generator of the invention may continue to operate under normal conditions.

According to the piezoelectric power generator of the invention, since the piezoelectric portions are formed so as to extend to the root portion at the support end of the vibrating arm of multilayered beam structure, a larger amount of electric energy may be taken out per cycle of vibration, thereby providing a power generator having high conversion efficiency. Since the vibrating arm has a triangular or trapezoidal shape so that relatively large parts of the piezoelectric portions are located on the side of the support end, electric power may be generated by efficiently utilizing strain energy concentrated in the root portion of the vibrating arm. Further, by employing a structure capable of converting mechanical energy into electric energy by utilization of the longitudinal effect, the piezoelectric power generator of the invention converts mechanical energy stored in the vibrating arm into electric energy with extremely high efficiency. As a result, the invention provides a power generator using a piezoelectric substance that is small in size which may be incorporated into portable devices.

Further, the piezoelectric portions each have a laminated structure so that the capacitance and the electromotive voltage may be optimally set in match with the charging system and may be set in the condition suitable for application to small-sized portable devices without changing the size of the power generator. Consequently, the invention provides a power generator using a piezoelectric substance which practically accumulates electric energy in a condenser or the like with high charging efficiency.

Moreover, self-attenuation of vibrations is also taken into consideration and a piezoelectric power generator with less self-attenuation and high efficiency of conversion into electric energy is realized by combining two vibrating arms in the form of a tuning fork. Then, by imparting displacements in opposite directions to the vibrating arms, the arms may vibrate in the tuning-fork vibration mode from the beginning with less vibration leakage, thereby reducing vibration energy loss at the initial stage and generating electric power with higher conversion efficiency.

Thus, according to the invention, a highly efficient piezoelectric power generator suitable for small-sized portable devices may be realized, and portable electronic devices having various functions and capable of being used safely and positively anytime and anywhere may also be realized by employing the piezoelectric power generator.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A portable power supply unit having a piezoelectric power generator, comprising: two vibrating arms each having a free end being able to freely vibrate and a support end for supporting said free end, coupling member for coupling said support ends of said two vibrating arms, at least two piezoelectric portions disposed on each of said vibrating arms with a support layer disposed therebetween, each vibrating arm including at least one electrode covering at least parts of each of said piezoelectric portions or a respective vibrating arm, each of said vibrating arms including a power generating, section capable of outputting an alternating current through said electrodes; a vibration applying mechanism for imparting displacements to said vibrating arms to cause a first of said two vibrating arms to move in a direction opposite to the other, said vibration applying mechanism comprising a hitting portion for striking said one free end of said two vibrating arms in a direction toward the other vibrating arm and a wall portion against which said other free end of the vibrating arm strikes when a hit is applied to said one vibrating arm so that said two vibrating arms are vibrated by being sandwiched between said hitting portion and said wall portion; rectifying device coupled to said power generator, for rectifying the alternating current output from said power generator; and an electric condensing device, coupled to said rectifying device, for accumulating a rectified current.

2. The portable power supply unit of claim 1, wherein said hitting portion of said vibration applying mechanism includes a weight in the form of a pendulum, said pendulum including a head portion, said head portion striking against one of said vibrating arms with motion from said pendulum.

3. A portable power supply unit having a piezoelectric power generator, comprising: two vibrating arms each having a free end being able to freely vibrate and a support end for supporting said free end, coupling member for coupling said support ends of said two vibrating arms, said two vibrating arms being supported such that said two vibrating arms and coupling member act in unison to move like a pendulum, at least two piezoelectric portions disposed on each of said vibrating arms with a support layer disposed therebetween, each vibrating arm including at least one electrode covering at least parts of each of said piezoelectric portions or a respective vibrating arm, each of said vibrating arms including a power generating section capable of outputting an alternating current through said electrodes; a vibration applying mechanism for imparting displacements to said vibrating arms to cause a first of said two vibrating arms to move in a direction opposite to the other, said vibration applying mechanism including a wall portion, said free end of one of said vibrating arms striking against said wall portion to create vibrations, said vibrations being applied to said two vibrating arms when said vibrating arms are moved relative to said wall and said free end of at least one of said vibrating arms strikes against said wall portion; a rectifying device coupled to said power generator, for rectifying the alternating current output from said power generator; and an electric condensing device, coupled to said rectifying device, for accumulating a rectified current.

4. A portable power supply unit having a piezoelectric power generator, comprising: two vibrating arms each having a free end being able to freely vibrate and a support end for supporting said free end, coupling member for coupling said support ends of said two vibrating arms, at least two piezoelectric portions disposed on each of said vibrating arms with a support layer disposed therebetween, each vibrating arm including at least one electrode covering at least parts of each of said piezoelectric portions or a respective vibrating arm, each of said vibrating arms including a power generating section capable of outputting an alternating current through said electrodes; a vibration applying mechanism for imparting displacements to said vibrating arms to cause a first of said two vibrating arms to move in a direction opposite to the other, said vibration applying mechanism including a hitting portion for striking against substantially the center of said coupling member so that vibrations are applied to said two vibrating arms when said hitting portion strikes against said coupling member; a rectifying device coupled to said power generator, for rectifying the alternating current output from said power generator; and an electric condensing device, coupled to said rectifying device, for accumulating a rectified current.

* * * * *